US006658117B2

(12) United States Patent
Hasebe

(10) Patent No.: US 6,658,117 B2
(45) **Date of Patent: *Dec. 2, 2003**

(54) SOUND FIELD EFFECT CONTROL APPARATUS AND METHOD

(75) Inventor: Kiyoshi Hasebe, Hamamatsu (JP)

(73) Assignee: Yamaha Corporation, Hamamatsu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/436,139

(22) Filed: Nov. 9, 1999

(65) Prior Publication Data

US 2002/0057806 A1 May 16, 2002

(30) Foreign Application Priority Data

Nov. 12, 1998 (JP) ........................................ 10-322616

(51) Int. Cl.[7] ................................................ H03G 3/00
(52) U.S. Cl. ............................ 381/61; 381/19; 381/18
(58) Field of Search ............................ 381/18, 19, 20, 381/21, 61, 63

(56) References Cited

U.S. PATENT DOCUMENTS 5,146,507 A * 9/1992 Satoh ........................ 381/63
5,524,053 A * 6/1996 Iwamatsu .................... 381/18
5,546,465 A * 8/1996 Kim ........................... 381/63
5,680,464 A * 10/1997 Iwamatsu .................... 381/18

* cited by examiner

*Primary Examiner*—Minsun Oh Harvey
(74) *Attorney, Agent, or Firm*—Morrison & Foerster LLP

(57) ABSTRACT

A sound field effect control apparatus and and a sound field effect control method are provided, which are capable of enabling a listener to listen to reflected sounds close to initial reflected sounds generated in an actual acoustic space, by utilizing information reflecting the position of a sound source possessed by multichannel audio source signals. Sound field effects are applied to multichannel audio source signals that are input to a sound field effect control apparatus. The multichannel audio source signals cause sound generated from an imaginary sound source at a predetermined position to be heard by the listener when converted into sound and generated by a plurality of loudspeakers. Multichannel initial reflected sound signals corresponding to initial reflected sounds that will be heard by the listener when the sound is generated from said imaginary sound source at said predetermined position in a predetermined acoustic space, are generated from the multichannel audio source signals.

1 Claim, 15 Drawing Sheets

*FIG.5A* WHEN IMAGINARY SOUND SOURCE P IS POSITIONED BETWEEN RF AND LF
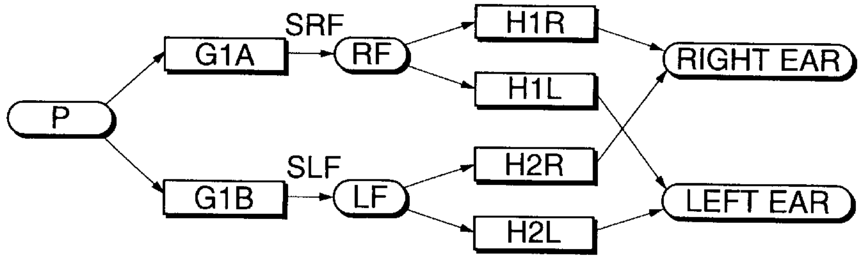
*FIG.5B* WHEN IMAGINARY SOUND SOURCE P IS POSITIONED BETWEEN RF AND RR
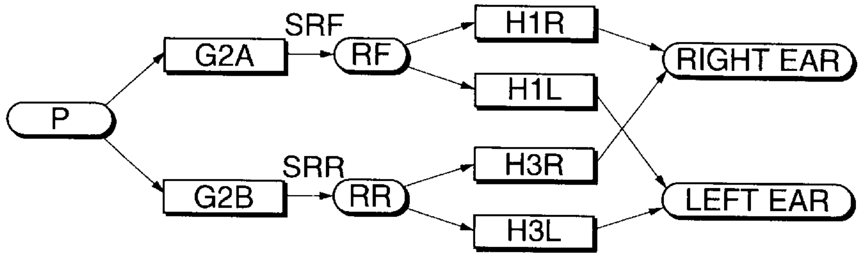
*FIG.5C* WHEN IMAGINARY SOUND SOURCE P IS POSITIONED BETWEEN LR AND LF
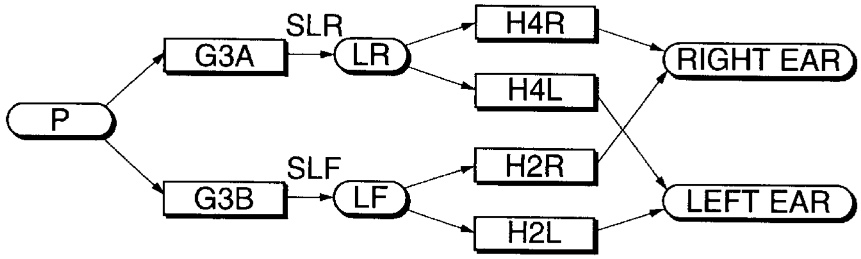
*FIG.5D* WHEN IMAGINARY SOUND SOURCE P IS POSITIONED BETWEEN LR AND RR
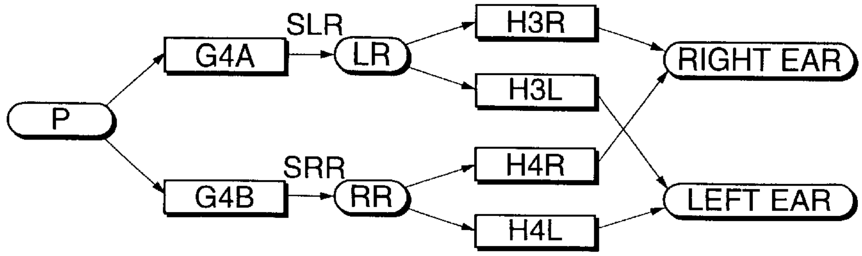

*FIG.8A* PRIMARY REFLECTED SOUND(i)
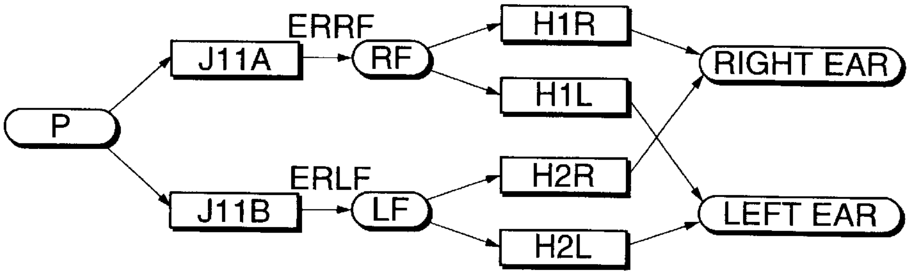
*FIG.8B* PRIMARY REFLECTED SOUND(ii)
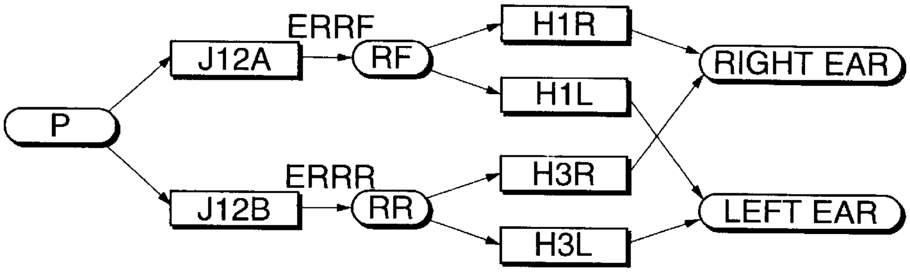
*FIG.8C* PRIMARY REFLECTED SOUND(iii)
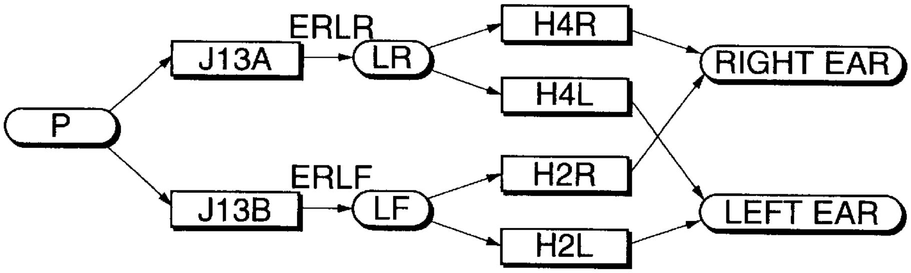
*FIG.8D* PRIMARY REFLECTED SOUND(iv)
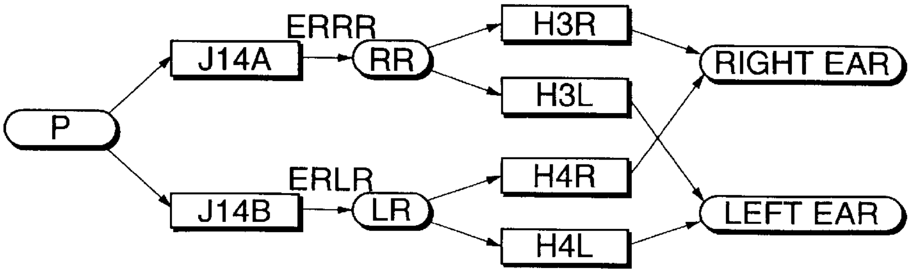

FIG.13

| | RF | LF | RR | LR |
|---|---|---|---|---|
| SRF | (i) J11A/G1A<br>(i) J12A/G1A<br>(ii) J21A/G2A<br>(ii) J22A/G2A | (ii) J21B/G2A | (i) J12A/G1A<br>(i) J14A/G1A | |
| SLF | (iii) J31A/G3B<br>(iii) J32A/G3B | (i) 1 J11B/G1B<br>(i) 1 J13B/G1B<br>(iii) 3 J31B/G3B<br>(iii) 3 J33B/G3B | | (i) J13A/G1B<br>(i) J14B/G1B |
| SRR | (iv) J41A/G4A | (ii) 2 J23B/G2A | (ii) J22B/G2B<br>(ii) J24A/G2B<br>(iv) J42B/G4A<br>(iv) J44A/G4A | (ii) J23A/G2B<br>(ii) J24B/G2B |
| SLR | (iv) J42A/G4A | (iv) 4 J41B/G4B<br>(iv) 4 J43B/G4B | (iii) J32B/G3A<br>(iii) J34A/G3A | (iii) J33A/G3A<br>(iii) J34B/G3A<br>(iv) J43A/G4B<br>(iv) J44B/G4B |

SOUND FIELD EFFECT CONTROL APPARATUS AND METHOD

BACKGROUND OF THE INVENTION

1. Field of the Invention

The present invention relates to a sound field effect control apparatus and a sound field effect control method which apply sound field effects to multichannel audio source signals.

2. Prior Art

To simulate various acoustic spaces such as halls and churches, there have used field effect control apparatuses which apply sound field effects to audio source signals to be reproduced. In recent years, sound field effect control apparatuses have been proposed to apply sound field effects to multichannel audio source signals as the audio source signals.

Important factors that characterize an actual acoustic space include initial reflected sounds and reverberant sounds. The initial reflected sounds are generated by reflection of sound emitted from a sound source by walls of the acoustic space and delivered to the listeners ears. Therefore, the direction, intensity or the like of the initial reflected sounds reflect the position of generation of the original sound in the acoustic space more faithfully than the reverberant sounds.

The conventional sound field effect control apparatuses for applying sound field effects to multichannel audio source signals are, however, constructed so as to apply sound field effects by synthesizing the audio source signals into a monaural source signal, then subjecting the monaural source signal to operations of delay and multiplication by coefficient(s) to obtain a reflected sound signal, and reproducing the obtained reflected sound signal which is monaural by a plurality of loudspeakers. According to this method, information related to the sound source position that was possessed by the original multichannel audio source signals is lost by the synthesization of the audio source signals into the monaural source signal, and therefore the resulting initial reflected sounds each do not have a direction and intensity determined by the position of the sound source.

SUMMARY OF THE INVENTION

It is therefore an object of the present invention to provide a sound field effect control apparatus and and a sound field effect control method which are capable of enabling a listener to listen to reflected sounds close to initial reflected sounds generated in an actual acoustic space, by utilizing information reflecting the position of a sound source possessed by multichannel audio source signals.

To attain the above object, the present invention provides a sound field effect control apparatus for applying sound field effects to multichannel audio source signals that are input to the sound field effect control apparatus, the multichannel audio source signals causing sound generated from an imaginary sound source at a predetermined position to be heard by a listener when converted into sound and generated by a plurality of loudspeakers, the apparatus comprising an initial reflected sound generating device that generates multichannel initial reflected sound signals corresponding to initial reflected sounds that will be heard by the listener when the sound is generated from the imaginary sound source at the predetermined position in a predetermined acoustic space, from the multichannel audio source signals.

In a preferred form of the present invention, the initial reflected sound generating device comprises a plurality of initial reflected sound generating devices that generate the multichannel initial reflected sound signals corresponding, respectively, to a plurality of predetermined positions of the imaginary sound source, from the multichannel audio source signals, and a control device that selects one of the plurality of initial reflected sound generating devices according to a selected one of the plurality of predetermined positions of the imaginary sound source, and causes the selected one initial reflected sound generating device to create the multichannel initial reflected sound signals.

Further, in a preferred form of the present invention, the initial reflected sound generating device comprises a plurality of signal processing circuits each connected between one of a plurality of first signal lines through which respective ones of the multichannel audio source signals are input, and a plurality of second signal lines through which respective ones of the multichannel initial reflected sound signals are output.

A concrete example of the initial reflected sound generating device comprises a plurality of delay circuits that delay respective ones of the multichannel audio source signals, a plurality of multipliers that multiplies respective ones of the multichannel audio source signals which are delayed by the delay circuits by predetermined coefficients, and a plurality of adders that add respective ones of a plurality of predetermined combinations of output signals from the multipliers and output results of the addition as the multichannel initial reflected sound signals.

Preferably, multichannel audio source signals correspond to respective ones of the plurality of loudspeakers, and are each created based upon a first transmission function of a signal Transmission path extending from the imaginary sound source at the predetermined position to ears of the listener, a second transmission function of a signal transmission path extending from the imaginary sound source at the predetermined position to a corresponding one of the plurality of loudspeakers, and a third transmission function of a signal transmission path extending from the corresponding one of the plurality of loudspeakers, and the initial reflected sound generating part creates the multichannel initial reflected sound signals by subjecting the multichannel audio source signals to signal processing based upon a fourth transmission function forming a transmission function of a signal transmission path extending from the imaginary sound source at the predetermined position to the ears of the listener, and the second transmission function.

To attain the above object, the present invention further provides a sound field effect control method for receiving multichannel audio source signals and applying sound field effects to the multichannel audio source signals that are input, the multichannel audio source signals causing sound generated from an imaginary sound source at a predetermined position to be heard by a listener when converted into sound and generated by a plurality of loudspeakers, the method comprising an initial reflected sound generating step of generating multichannel initial reflected sound signals corresponding to initial reflected sounds that will be heard by the listener when the sound is generated from the imaginary sound source at the predetermined position in a predetermined acoustic space, from the multichannel audio source signals.

The above and other objects, feature, and advantages of the invention will become more apparent from the following detailed description taken in conjunction with the accompanying drawings.

BRIEF DESCRIPTION OF THE DRAWINGS

FIGS. 5A–5D are views showing, by way of example, signal processing systems for generating sound from various imaginary sound sources at respective different positions, to be listened to by a listener, using two loudspeakers;

FIGS. 8A to 8D are views showing examples of signal processing systems for generating initial reflected sound signals that simulate primary reflected sounds from respective different walls based upon studio-recorded sound;

FIG. 13 shows a table useful in explaining functions required by a first exemplary construction of an initial reflected sound generating part of the embodiment;

DETAILED DESCRIPTION OF PREFERRED EMBODIMENT

The present invention will be described in detail with reference to the accompanying drawings showing a preferred embodiment thereof.

A. Outline of the construction of the present embodiment

Figure 1:
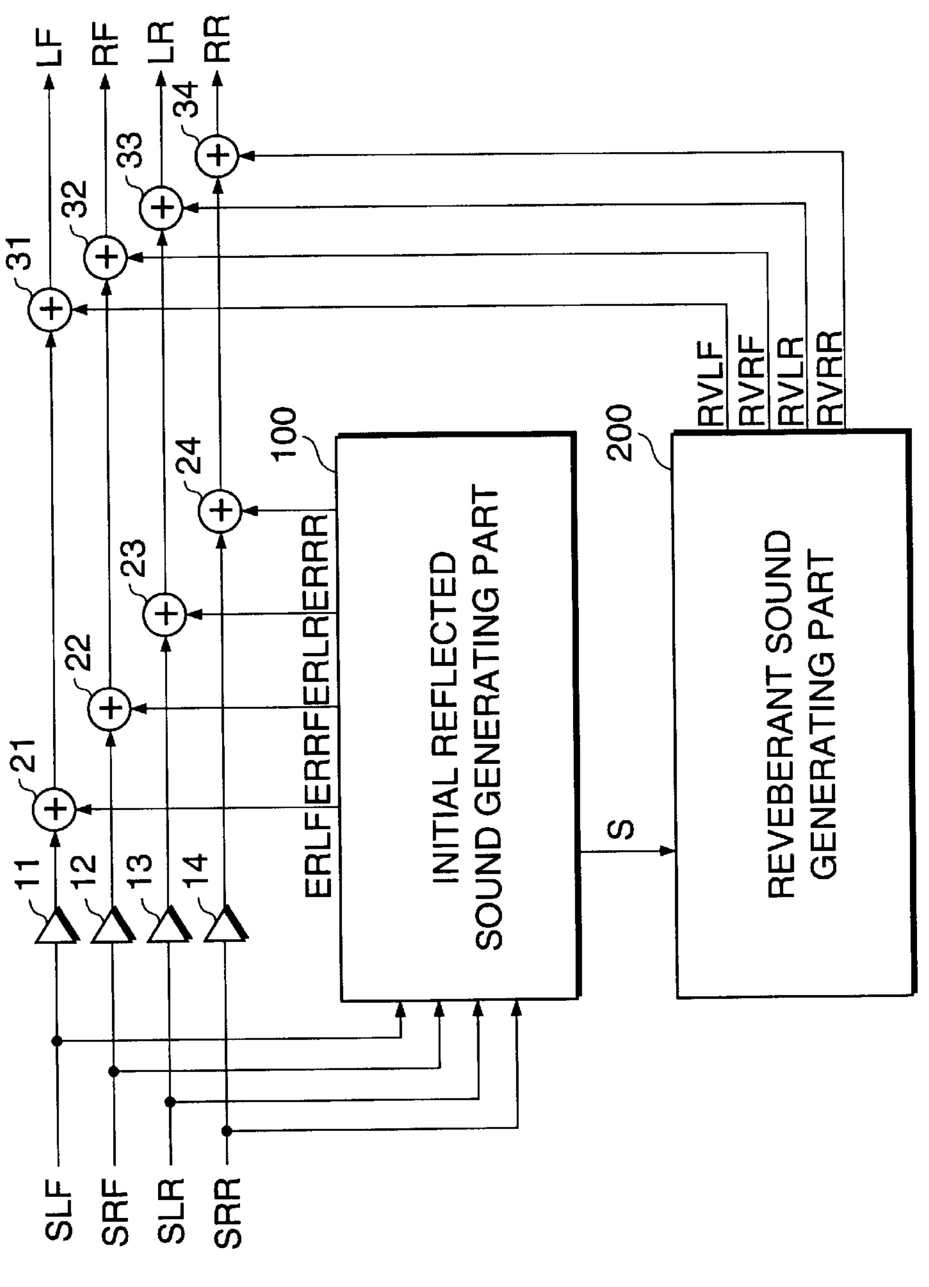
FIG. 1 is a block diagram showing the construction of a sound field effect control apparatus according to one embodiment of the present invention.

Referring first to FIG. 1, there is shown the construction of an sound field effect control apparatus according to one embodiment of the present invention.

The sound field effect control apparatus processes 4-channel audio source signals SLF, SRF, SLR and SRR. These signals contain information corresponding to sound generated from one or more sound sources, which was recorded in an anechoic studio or the like. Each of the audio source signals SLF, SRF, SLR and SRR is created so as to give a listener auditory effects which are similar to those of recorded sound generated from a corresponding one of predetermined imaginary sound sources when it is generated from a corresponding one of a left front loudspeaker LF, a right front loudspeaker RF, a left rear loudspeaker LR, and a right rear loudspeaker RR with respect to the listener. Details of the audio source signals SLF, SRF, ,SLR and SRR will be described hereinafter.

The sound field effect control apparatus according to the present embodiment applies sound field effects corresponding to an acoustic space selected by a user, such as a concert hall, a movie theater, and a church, to the 4-channel audio source signals SLF, SRF, SLR and SRR. Such sound field effects applied to the audio source signals include initial reflected sounds and reverberant sounds.

First, the initial reflected sounds and means for generating the same will be described. An acoustic space selected by the user is usually enclosed by several walls. When sound, based upon which the audio source signals SLF, SRF, SLR and SRR were generated, is emitted from a predetermined imaginary sound source within an acoustic space, it reaches each of walls enclosing the acoustic space, and is reflected from the walls to reach the listener. In this case, the incoming direction and intensity of each of reflected sounds from the walls are determined by the positional relationship between each of the walls of the acoustic space, the listener in the acoustic space, and the sound source.

In FIG. 1, reference numeral 100 designates an initial reflected sound generating part which generates 4-channel initial reflected sound signals ERLF, ERRF, ERLR, and ERRR corresponding to initial reflected sounds from the walls of an acoustic space as above, from the 4-channel audio source signals SLF, SRF, SLR and SRR. The 4-channel initial reflected sound signals ERLF, ERRF, ERLR, and ERRR are also created so as to be generated from the left front loudspeaker LF, right front loudspeaker RF, left rear loudspeaker LR, and right rear loudspeaker RR, respectively. In other words, the initial reflected sound generating part 100 creates the 4-channel initial reflected sound signals ERLF, ERRF, ERLR, and ERRR such that these initial reflected sound signals give the listener auditory effects similar to those of reflected sounds from the walls of the acoustic space which the listener hears when these initial reflected sound signals are generated from the respective corresponding loudspeakers. The present embodiment is characterized by a manner of generating the initial reflected sound signals ERLF, ERRF, ERLR, and ERRR by the initial reflected sound generating part 100, which manner will be described hereinafter.

Next, the reverberant sounds and means for generating the same will be described. Sound emitted from an imaginary sound source in an acoustic space is repeatedly reflected by the walls of the acoustic space while declining progressively and also changing in its spectral distribution. Consequently, a group of reflected sounds remain in the acoustic space, which are irregular in phase and have low waveform correlation. The group of reflected sounds are heard by the listener in the form of astatic reverberant sounds remaining around the listener. The astatic reverberant sounds are the reverberant sounds.

In FIG. 1, reference numeral 200 designates a reverberant sound generating part which creates 4-channel reverberant sound signals RVLF, RVRF, RVLR, and RVRR corresponding to the reverberant sounds, using a monaural audio source signal S supplied from the initial reflected sound generating part 100. In the arrangement of FIG. 1, the initial reflected sound generating part 100 synthesizes the monaural audio source signal S from the 4-channel audio source signals SLF, SRF, SLR and SRR.

The sound field effect control apparatus according to the present embodiment includes coefficient multipliers 11–14, adders 21–24, and adders 31–34, in addition to the above described initial reflected sound generating part 100 and reverberant sound generating part 200. The coefficient multipliers 11–14 multiplies the 4-channel audio source signals SLF, SRF, SLR and SRR by predetermined coefficients. The adders 21–24 add the 4-channel audio source signals multiplied by the coefficients and the 4-channel initial reflected sound signals ERLF, ERRF, ERLR, and ERRR from the initial reflected sound generating part 100, respectively. The adders 31–34 add the 4-channel audio signals (source signals+initial reflected sound signals) from the adders 21–24 and the 4-channel reverberant sound signals RVLF, RVRF, RVLR, and RVRR from the reverberant sound generating part 200, respectively, and supply the respective sums to the left front loudspeaker LF, right front loudspeaker RF, left rear loudspeaker LR, and right rear loudspeaker RR, respectively.

B. Manner of generating initial reflected sound signals (1) Multichannel audio source signals In the present embodiment, the 4-channel initial reflected sound signals ERLF, ERRF, ERLR, and ERRR are created from the 4-channel audio source signals SLF, SRF, SLR and SRR. The audio source signals SLF, SRF, SLR and SRR used for creation of the initial reflected sound signals will be described with reference to FIGS. 2 to 5D.

Figure 2:
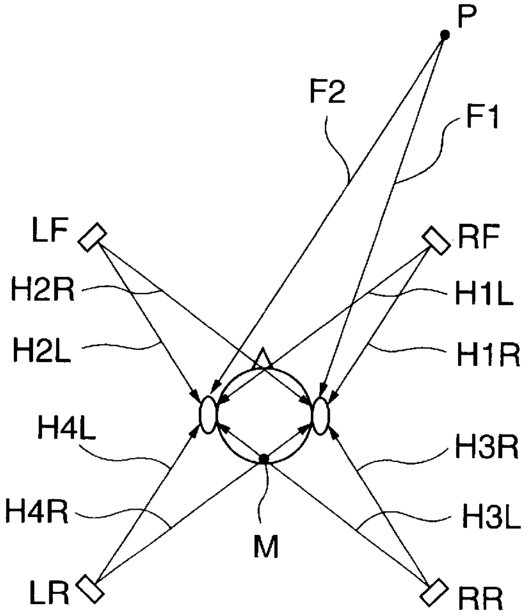
FIG. 2 is a view showing an example of the position of an imaginary sound source and the arrangement of loudspeakers corresponding to audio source signals to be processed by the FIG. 1 embodiment.

Referring first to FIG. 2, the left front loudspeaker LF, right front loudspeaker RF, left rear loudspeaker LR, and right rear loudspeaker RR are arranged around a listener M. The audio source signals SLF, SRF, SLR and SRR are created to be generated respectively from these loudspeakers. In FIG. 2, P represents an imaginary sound source provided for the listener M by the audio source signals SLF, SRF, SLR and SRR. That is, the audio source signals SLF, SRF, SLR and SRR are created so as to give the listener M similar effects to those of sound generated by the imaginary sound source P when they are generated respectively by the loudspeakers LF, RF, LR and RR.

Figure 3:
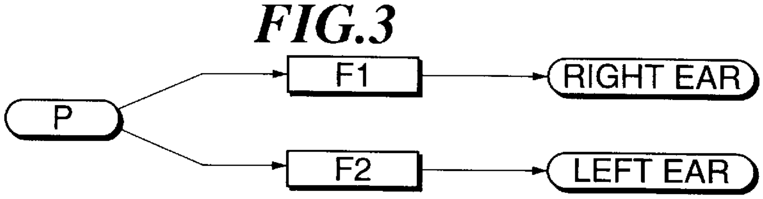
FIG. 3 is a view showing, by way of example, a signal transmission system extending from the imaginary sound source to the ears of a listener.

Such audio source signals SLF, SRF, SLR and SRR can be created in the following manner, for example:

First, in FIG. 2, symbol F1 represents a transmission function of a signal transmission path from the imaginary sound source P to the right ear of the listener M, and symbol F2 represents a transmission function of a signal transmission path from the imaginary sound source P to the left ear of the listener M. An acoustic signal transmission system from the imaginary sound source P to the left and right ears of the listener M is shown in FIG. 3.

Further, in FIG. 2, symbols H1R and H1L represent transmission functions of signal transmission paths from the right front loudspeaker RF to the right ear and left ear of the listener M, symbols H2R and H2L transmission functions of signal transmission paths from the left front loudspeaker LF to the right ear and left ear of the listener M, symbols H3R and H3L transmission functions of signal transmission paths from the right rear loudspeaker RR to the right ear and left ear of the listener M, and symbols H4R and H4L functions of signal transmission paths from the left rear loudspeaker LR to the right ear and left ear of the listener M.

When the audio source signals SRF, SLF, SRR and SLR are required for the listener M to listen to sound from the imaginary sound source P under the conditions shown in FIG. 2, these audio source signals can be obtained by subjecting studio-recorded sound (hereinafter referred to as "the sound P") to respective kinds of signal processing corresponding respectively to transmission functions GRF, GLF, GRR and GLR which satisfy the following formulas (1) and (2):

$$F1=GRF\cdot H1R+GLF\cdot H2R+GRR\cdot H3R+GLR\cdot H4R \quad (1)$$

$$F2=GRF\cdot H1L+GLF\cdot H2L+GRR\cdot H3L+GLR\cdot H4L \quad (2)$$

Figure 4:
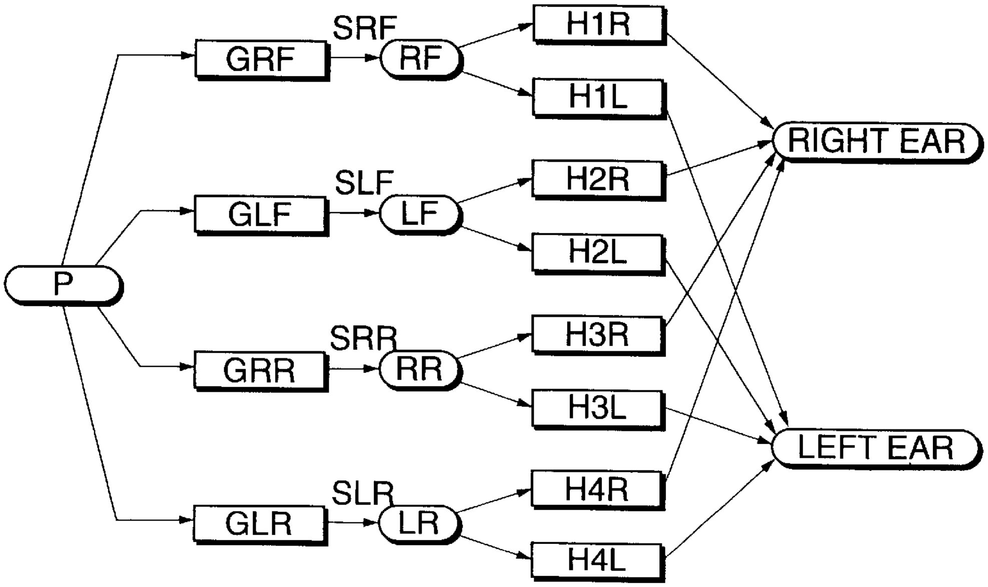
FIG. 4 is a view showing an example of a signal processing system for generating sound from the imaginary sound source, that is listened to by a listener, using four loudspeakers.

FIG. 4 shows a signal processing process for obtaining the audio source signals SRF, SLF, SRR and SLR from the sound P and a signal transmission system through which these audio source signals are transmitted from the loudspeakers RF, LF, RR and LR to the ears of the listener. In the case where the above formulas (1) and (2) are satisfied, the signal transmission system shown in FIG. 4 is completely equivalent to the signal transmission system shown in FIG. 3. Thus, by generating the audio source signals SRF, SLF, SRR and SLR from the loudspeakers RF, LF, RR and LR, auditory effects similar to those received when the listener M listens to the sound from the imaginary sound source P can be given to the listener M.

According to the above described manner, theoretically, 4-channel audio source signals corresponding to the position of an arbitrary imaginary sound source can be created. However, the amount of calculation of the transmission functions GRF, GLF, GRR and GLR that satisfy the above formulas (1) and (2) will be very large. On the other hand, four loudspeakers are not always required for the listener M to listen to sound having a certain acoustic image position, but the use of at least two loudspeakers suffices. If only two loudspeakers are used, two of the above transmission functions GRF, GLF, GRR and GLR may be fixed at zero, and the other two functions may be determined by calculation so that the required calculation amount can be largely reduced. Therefore, it is practical to select two loudspeakers according to the position of the imaginary sound source P, and create only audio source signals of channels corresponding to the selected loudspeakers.

FIGS. 5A to 5D show processes of creation of audio source signals according to this practical manner and processes of transmission of the created audio source signals to the listener.

First, in the case where the imaginary sound source P is positioned in a direction between the loudspeaker RF and the loudspeaker LF as viewed from the listener M, the audio source signals SRF and SLF corresponding to the loudspeakers RF and LF are created, as shown in FIG. 5A. The audio source signals SRF and SLF are created by subjecting the studio-recorded sound P to respective kinds of signal processing corresponding respectively to transmission functions G1A and G1B which satisfy the following formulas (3) and (4):

$$F1=G1A\cdot H1R+G1B\cdot H2R \quad (3)$$

$$F2=G1A\cdot H1L+G1B\cdot H2L \quad (4)$$

In the case where the imaginary sound source P is positioned in a direction between the loudspeaker RF and the loudspeaker RR as viewed from the listener M, the audio source signals SRF and SRR corresponding to the loudspeakers RF and RR are created, as shown in FIG. 5B. Similarly, in the case where the imaginary sound source P is positioned in a direction between the loudspeaker LR and the loudspeaker LF as viewed from the listener M, the audio source signals SLR and SLF corresponding to the loudspeakers LR and LF are created, as shown in FIG. 5C, and in the case where the imaginary sound source P is positioned in a direction between the loudspeaker LR and the loudspeaker RR as viewed from the listener M, the audio source signals SLR and SRR corresponding to the loudspeakers LR and RR are created, as shown in FIG. 5D. The manner of creating the audio source signals and the manner of determining transmission functions G2A, G2B, G3A, G3B, G4A and G4B required for the signal creation in these cases are similar to those in the above described case of creating audio source signals corresponding to the position of the imaginary sound source positioned in a direction between the loudspeakers RF and LF.

In the above described manner, audio source signals corresponding to an arbitrary imaginary sound source position can be created. By adding audio source signals corresponding to various imaginary sound source positions thus obtained, for each corresponding channel, 4-channel audio source signals SRF, SLF, SRR and SLR corresponding to a plurality of different imaginary sound source positions can be obtained.

(2) Manner of creating the initial reflected sound signals

Next, description will be made of the manner of creating the initial reflected sound signals according to the present embodiment.

Figure 6:
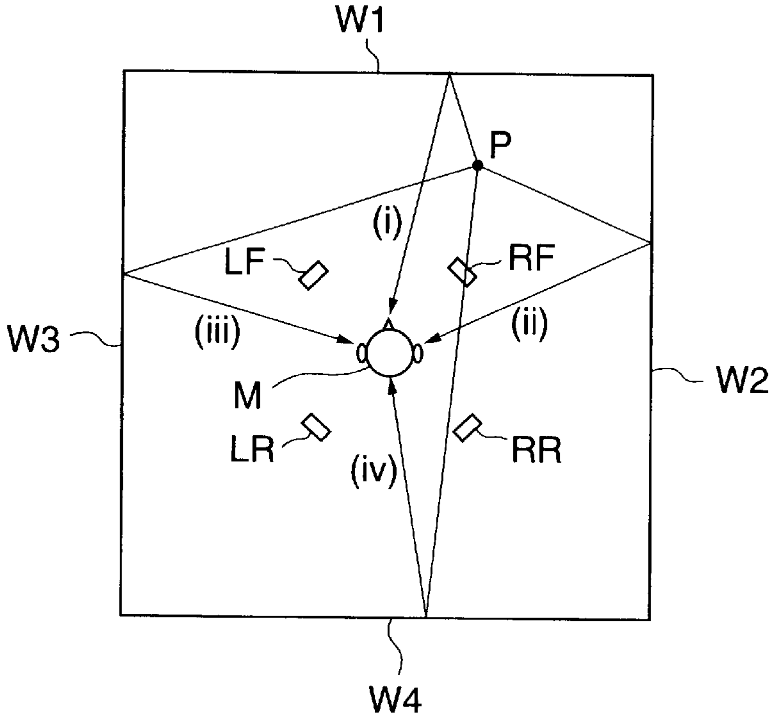
FIG. 6 is a view showing, by way of example, primary reflected sounds generated by reflection of sound from an imaginary sound source by walls of an acoustic space to be simulated.

Referring to FIG. 6, symbols W1–W4 represent walls enclosing an acoustic space selected as an object to be simulated by a user of the sound field effect control apparatus according to the present embodiment. Further, in FIG. 6, there is shown the position of the imaginary sound source P provided for the listener M when the audio source signals SRF, SLF, SRR and SLR are generated from the loudspeakers RF, LF, RR and LR.

Assuming that in FIG. 6 the walls W1–W4 actually exist and sound is actually generated from the imaginary sound source P, the generated sound is emitted in all directions and reflected sounds (i)–(iv) from the walls W1–W4 reach the listener M. These reflected sounds are transmitted through signal transmission paths with respective different lengths and reach the listener M from respective different directions, as shown in FIG. 6. Although each of the reflected sounds (i)–(iv) consists of a sound reaching the right ear of the listener M and a sound reaching the left ear of the listener M, each reflected sound is depicted as a single sound for avoiding complexity of illustration.

Figure 7:
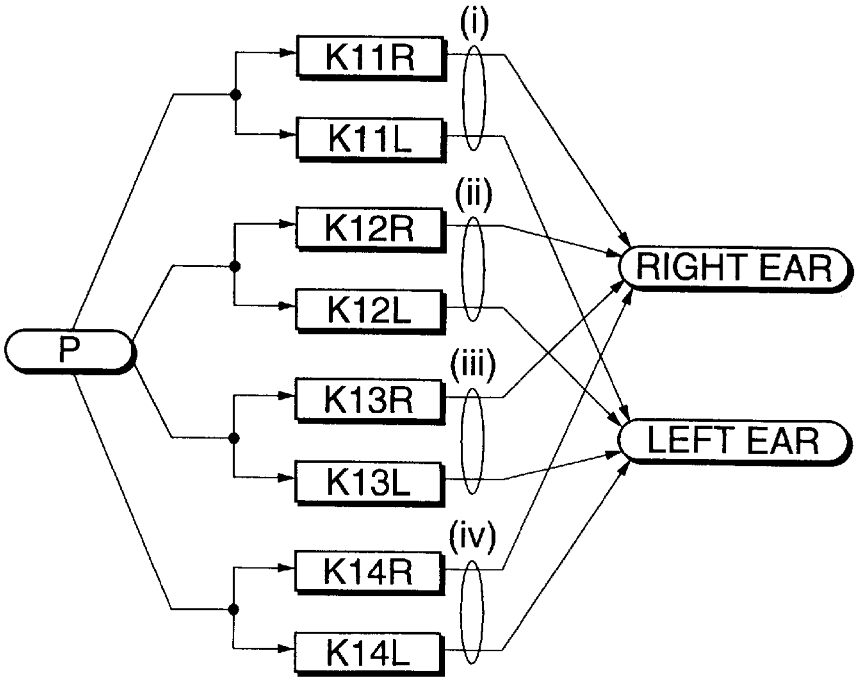
FIG. 7 is a view showing, by way of example, a signal processing system corresponding to transmission paths of the primary reflected sounds.

FIG. 7 shows a signal transmission system in which the sound generated from the imaginary sound source P advances to the walls W1–W4 from which it is reflected into primary reflected sounds (i)–(iv) to reach the right ear and left ear of the listener M. In FIG. 7, symbols K11R and K11L represent transmission functions of transmission paths corresponding to the primary reflected sound (i). Strictly speaking, the symbol K11R represents a transmission function of a transmission path extending from the imaginary sound source P to the right ear of the listener M via the wall W1, and the symbol K11L a transmission function of a transmission path extending from the imaginary sound source P to the left ear of the listener M via the wall W1. Similarly, symbols K12R and K12L represent transmission functions of transmission paths corresponding to the primary reflected sound (ii), K13R and K13L transmission functions of transmission paths corresponding to the primary reflected sound (iii), and K14R and K14L transmission functions of transmission paths corresponding to the primary reflected sound (iv).

Here, if studio-recorded sound is subjected to signal processing corresponding to the transmission functions K11R and K11L, for example, and the resulting audio signals are given to the listener M by a headphone or the like, he can hear sound corresponding to the reflected sound (i). This is the same with the other reflected sounds (ii)–(iv), that is, by subjecting studio-recorded sound to signal processing corresponding to the transmission paths of these reflected sounds and giving the resulting audio signals to the listener M, he can hear sounds corresponding the reflected sounds (ii)–(iv).

Similar signal processing to that mentioned above can be carried out using four loudspeakers, which is shown in FIGS. 8A–8D.

Referring first to FIG. 8A, a signal processing system for the listener M to hear the primary reflected sound (i) from the wall W1 is illustrated. In the system of FIG. 8A, studio-recorded sound P is subjected to signal processing corresponding to certain transmission functions J11A and J11B to create initial reflected sound signals ERRF and ERLF, which are generated from the loudspeakers RF and LF. Here, the transmission functions J11A and J11B are determined by solving the following formulas (5) and (6) with respect to the transmission functions J11A and J11B:

$$K11R=J11A\cdot H1R+J11B\cdot H2R \quad (5)$$

$$K11L=J11A\cdot H1L+J11B\cdot H2L \quad (6)$$

When the above formulas (5) and (6) are satisfied, the signal transmission system shown in FIG. 8A is completely equivalent to a portion of the signal transmission system corresponding to the reflected sound (i) of the signal processing system shown in FIG. 7. Thus, by generating the initial reflected sound signals ERRF and ERLF obtained by the above processing from the loudspeakers RF and LF, the listener M can hear the reflected sound (i) appearing in FIG. 6.

Next, FIG. 8B shows a signal processing system for the listener M to hear the primary reflected sound (ii) from the wall 2. In the system of FIG. 8B, studio-recorded sound P is subjected to signal processing corresponding to transmission functions J12A and J12B which satisfy the following formulas (7) and (8), and the resulting initial reflected sound signals ERRF and ERRR are generated from the loudspeakers RF and RR:

$$K12R=J12A\cdot H1R+J12B\cdot H3R \quad (7)$$

$$K12L=J12A\cdot H1L+J12B\cdot H3L \quad (8)$$

When the above formulas (7) and (8) are satisfied, the signal transmission system shown in FIG. 8B is completely equivalent to a portion of the signal transmission system corresponding to the reflected sound (ii) of the signal processing system shown in FIG. 7. Thus, by generating the initial reflected sound signals ERRF and ERRR obtained by the above processing from the loudspeakers RF and RR, the listener M can hear the reflected sound (ii) appearing in FIG. 6.

This is the same with the other reflected sounds (iii) and (iv). That is, the reflected sound (iii) is processed by a signal processing system shown in FIG. 8C such that initial reflected sound signals ERLR and ERLF are created in a manner similar to that described above, and these signals are generated from the loudspeakers LR and LF so that the listener M can hear the reflected sound (iii) appearing in FIG. 6. The reflected sound (iv) is processed by a signal processing system shown in FIG. 8D such that initial reflected sound signals ERRR and ERLR are created in a manner similar to that described above, and these signals are generated from the loudspeakers RR and LR so that the listener M can hear the reflected sound (iv) appearing in FIG. 6.

The initial reflected sound generating part 100 according to the present embodiment is supplied with only the 4-channel audio source signals SRF, SLF, SRR and SLR but not supplied with a signal of the original sound based upon which these signals were created (corresponding to the studio-recorded sound P). Therefore, in the present embodiment, the audio source signals SRF, SLF, SRR and SLR are used in place of the original sound signal to carry out signal processing equivalent to those shown in FIGS. 8A–8D.

First, if the imaginary sound source P is positioned in a direction between the loudspeakers RF and LF as shown in FIG. 6, only the audio source signals SRF and SLF are input to the initial reflected sound generating part 100. In this case, the original sound based upon which the audio signals were created (the studio-recorded sound P) can be determined from the audio source signal SRF or SLF using the following formula (9) or (10):

$$P=SRF/G1A \tag{9}$$

$$P=SLF/G1B \tag{10}$$

Therefore, using the above formulas (9) and (10), the signal processing systems shown in FIGS. 8A–8D which receive the studio-recorded sound P as an input signal can be equivalently deformed into a signal processing system which receives the audio source signals SRF and SLF as input signals. The signal processing system obtained by this equivalent deformation is shown in FIG. 9.

In the signal processing system of FIG. 8A described above, the original sound P is subjected to signal processing corresponding to the transmission functions J11A and J11B as noted above. In contrast, in the signal processing system of FIG. 9, the audio source signal SRF (=G1A·P) is subjected to signal processing corresponding to a transmission function J11A/G1A, and the audio source signal SLF (=G1B·P) is subjected to signal processing corresponding to a transmission function J11B/G1B. Also in this case, initial reflected sound signals ERRF and ERLF which are quite the same as those obtained by the signal processing system of FIG. 8A are obtained. Therefore, by generating these initial reflected sound signals ERRF and ERLF from the loudspeakers RF and LF, the listener M can hear the reflected sound (i) in FIG. 6.

Figure 9:
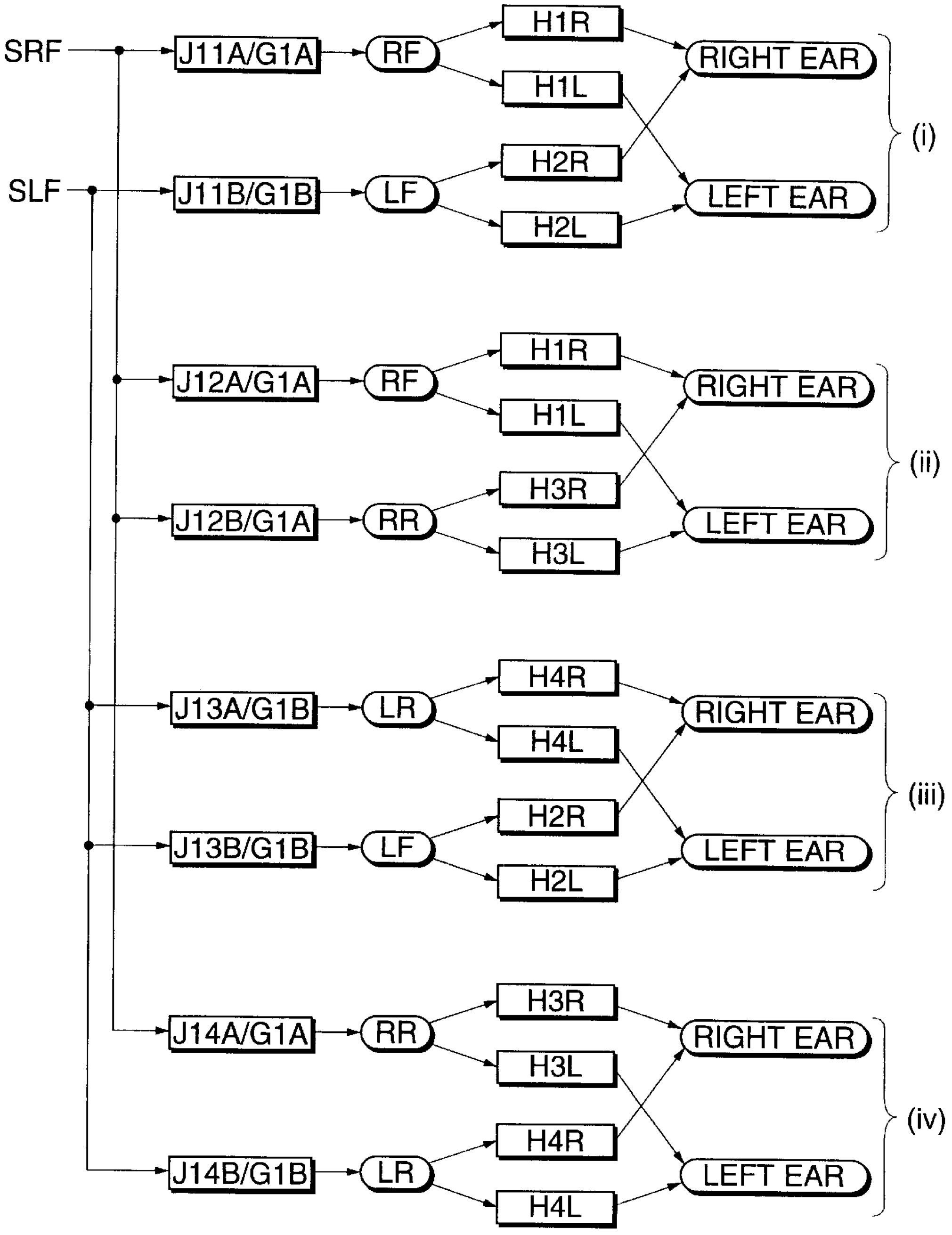
FIG. 9 is a view showing, by way of example, a signal processing system for generating initial reflected sound signals from audio source signals when the imaginary sound source is positioned in a direction between a front right loudspeaker and a front left loudspeaker.

This is the same with portions of the signal processing system of FIG. 9 corresponding to the other reflected sounds (ii)–(iv). These portions of the signal processing system of FIG. 9 are obtained by subjecting the signal processing systems shown in FIGS. 8B–8C to the equivalent deformation using the above formula (9) or (10).

If the imaginary sound source P is positioned at a location other than the above described location (i.e. in a direction between the loudspeakers RF and LF), the transmission paths of the primary reflected sounds (i)–(iv) are different from those shown in FIG. 6. Further, if the imaginary sound source P is positioned at a location other than the above described location, audio source signals corresponding to other loudspeakers than the loudspeakers RF and LF are delivered to the initial reflected sound generating part 100. Therefore, in this case, a signal processing system is required for creating initial reflected sound signals, which is different from the signal processing system shown in FIG. 9.

Figure 10:
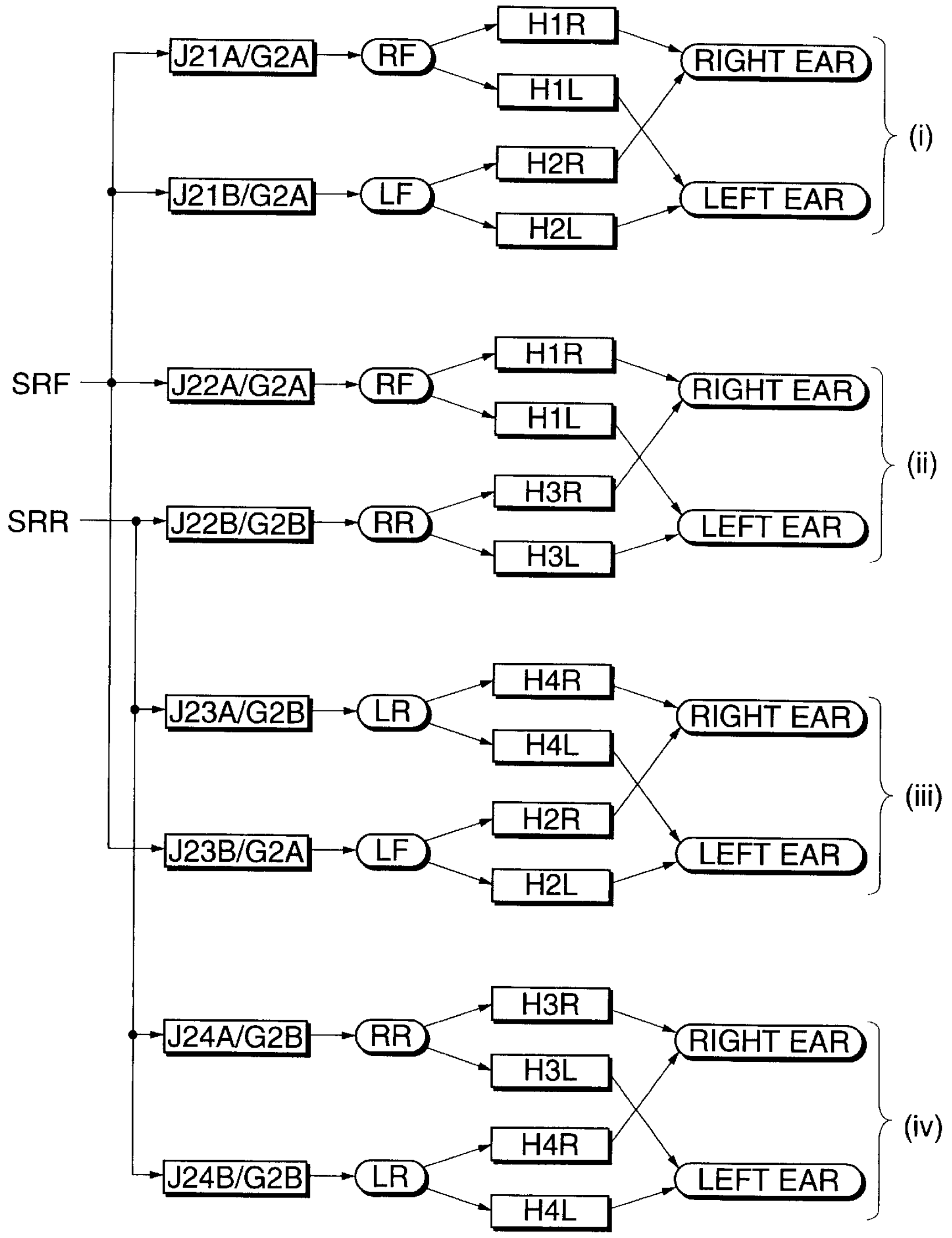
FIG. 10 is a view showing, by way of example, a signal processing system for generating initial reflected sound signals from audio source signals when the imaginary sound source is positioned in a direction between a front right loudspeaker and a rear right loudspeaker.
Figure 11:
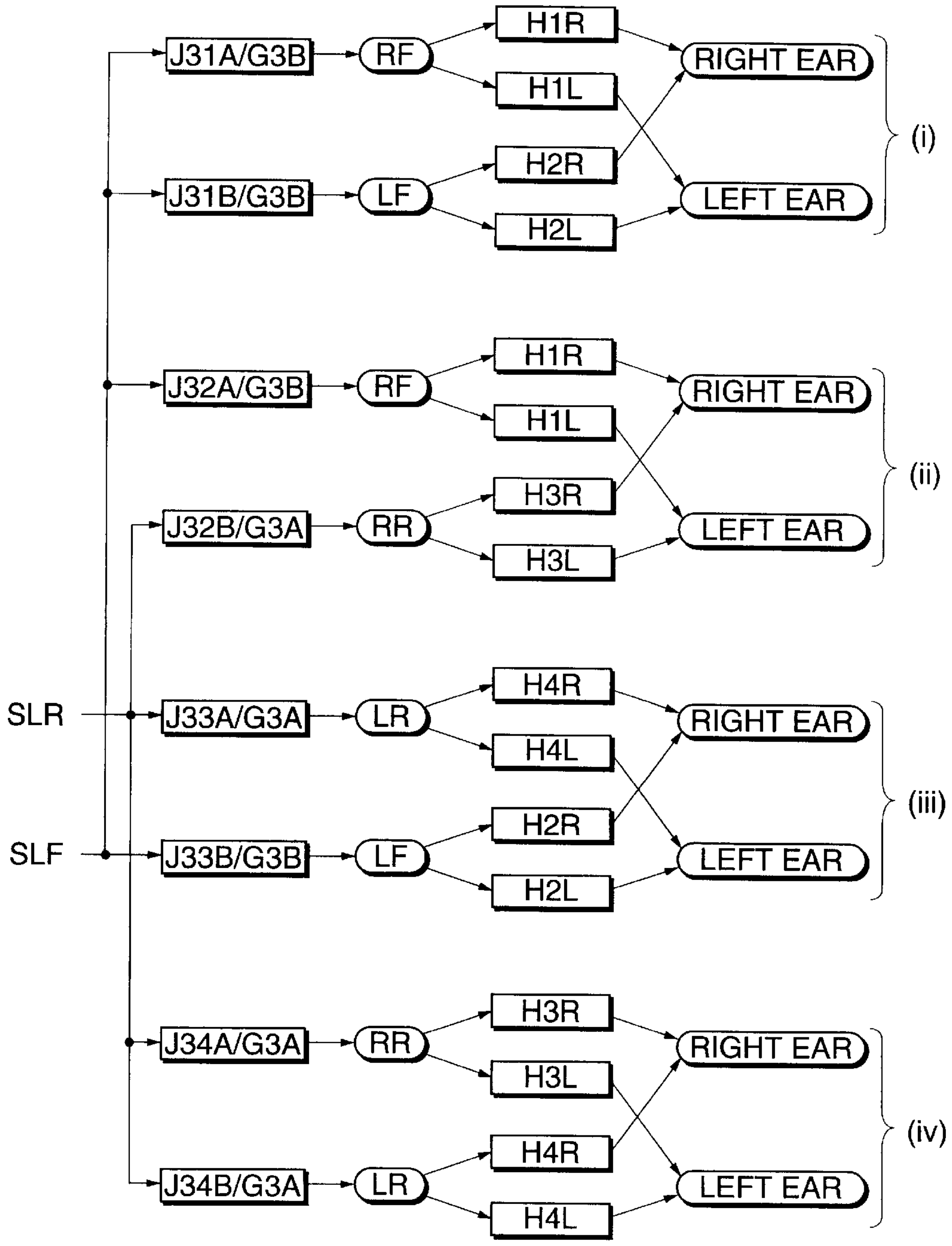
FIG. 11 is a view showing, by way of example, a signal processing system for generating initial reflected sound signals from audio source signals when the imaginary sound source is positioned in a direction between a front left loudspeaker and a rear left loudspeaker.
Figure 12:
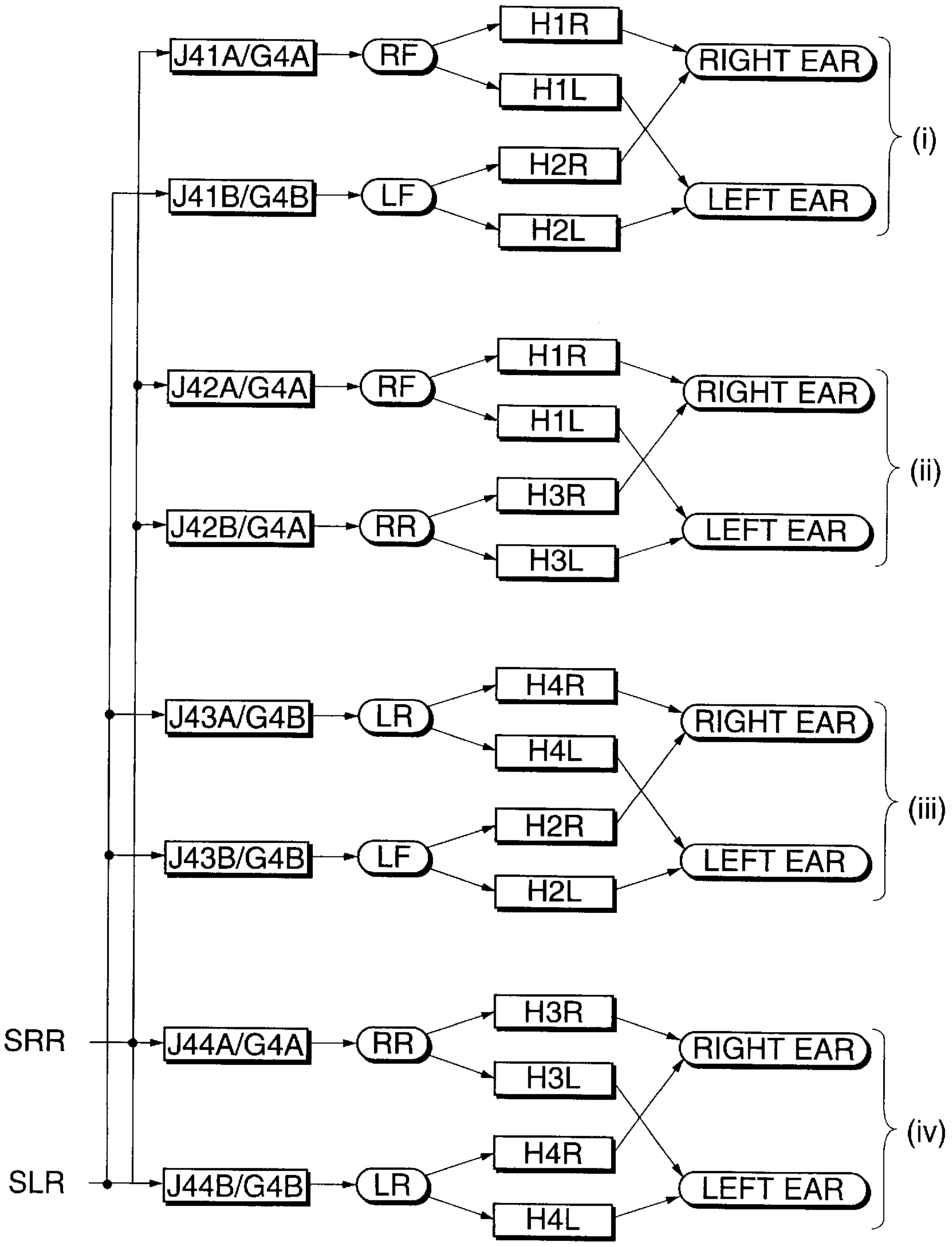
FIG. 12 is a view showing, by way of example, a signal processing system for generating initial reflected sound signals from audio source signals when the imaginary sound source is positioned in a direction between a rear right loudspeaker and a rear left loudspeaker.

FIG. 10 shows a signal processing system for generating initial reflected sound signals when the imaginary sound source P is positioned in a direction between the loudspeakers RF and RR, FIG. 11 shows a signal processing system for generating initial reflected sound signals when the imaginary sound source P is positioned in a direction between the loudspeakers LF and LR, and FIG. 12 shows a signal processing system for generating initial reflected sound signals when the imaginary sound source P is positioned in a direction between the loudspeakers RR and LR. In FIG. 10, transmission functions J21A, J21B, . . . , J24A, J24B correspond respectively to transmission paths of reflected sounds when the imaginary sound source P is positioned in a direction between the loudspeakers RF and RR, and are used in place of the transmission functions J11A, J11B, . . . , J14A, J14B in FIG. 9. Similarly, transmission functions J31A, J31B, . . . , J34A, J34B in FIG. 11 correspond respectively to transmission paths of reflected sounds when the imaginary sound source P is positioned in a direction between the loudspeakers LF and LR, and transmission functions J41A, J41B, . . . , J44A, J44B in FIG. 12 correspond respectively to transmission paths of the reflected sounds when the imaginary sound source P is positioned in a direction between the loudspeakers RR and LR. The signal processing systems shown in these figures are different in transmission functions used from the signal processing system of FIG. 9, but the principle of creation of initial reflected sound signals is identical with that of the system of FIG. 9.

In the present embodiment, basically signal processing systems as shown by way of example in FIGS. 9–12 are used to directly create the initial reflected sound signals ERRF, ERLF, ERRR and ERLR which are equivalent to the primary reflected sounds, from the 4-channel audio source signals SRF, SLF, SRR and SLR corresponding to an arbitrary imaginary sound source position. By employing this method, information related to the imaginary sound source position which is possessed by the original audio source signals can be directly reflected upon the initial reflected sound signals without being impaired.

C. Exemplary constructions of the initial reflected sound generation part 100

(1) First exemplary construction

Usually, multichannel audio source signals have contents reflecting plural kinds of sounds from different imaginary sound source positions. Therefore, to obtain initial reflected sound signals based upon primary reflected sounds corresponding to various imaginary sound source positions from such multichannel audio source signals, it is necessary to prepare signal processing systems corresponding to imaginary sound source positions as shown by way of example in FIGS. 9–12 and selectively use the signal processing systems according to the respective imaginary sound source positions.

The first exemplary construction of the initial reflected sound generating part 100 is adapted to receive audio source signals corresponding to any of the four imaginary sound source positions as employed in the signal processing systems of FIGS. 9–12 described above, and creates initial reflected sound signals based upon primary reflected sounds corresponding to the imaginary sound source position if such audio source signals are received.

A specific example of the first exemplary construction will now be described. Referring first to FIG. 13, transmission functions extracted from FIGS. 9–12 are shown, which are interposed between the 4-channel audio source signals SRF, SLF, SRR and SLR and the loudspeakers RF, LF, RR and LR. In FIG. 13, transmission functions with a prefix (i) are applied when the imaginary sound source P is positioned in a direction between the loudspeakers RF and LF, transmission functions with a prefix (ii) are applied when the imaginary sound source P is positioned in a direction between the loudspeakers RF and RR, transmission functions with a prefix (iii) are applied when the imaginary sound source P is positioned in a direction between the loudspeakers LF and LR, and transmission functions with a prefix (iv) are applied when the imaginary sound source P is positioned in a direction between the loudspeakers RR and LR.

Figure 14:
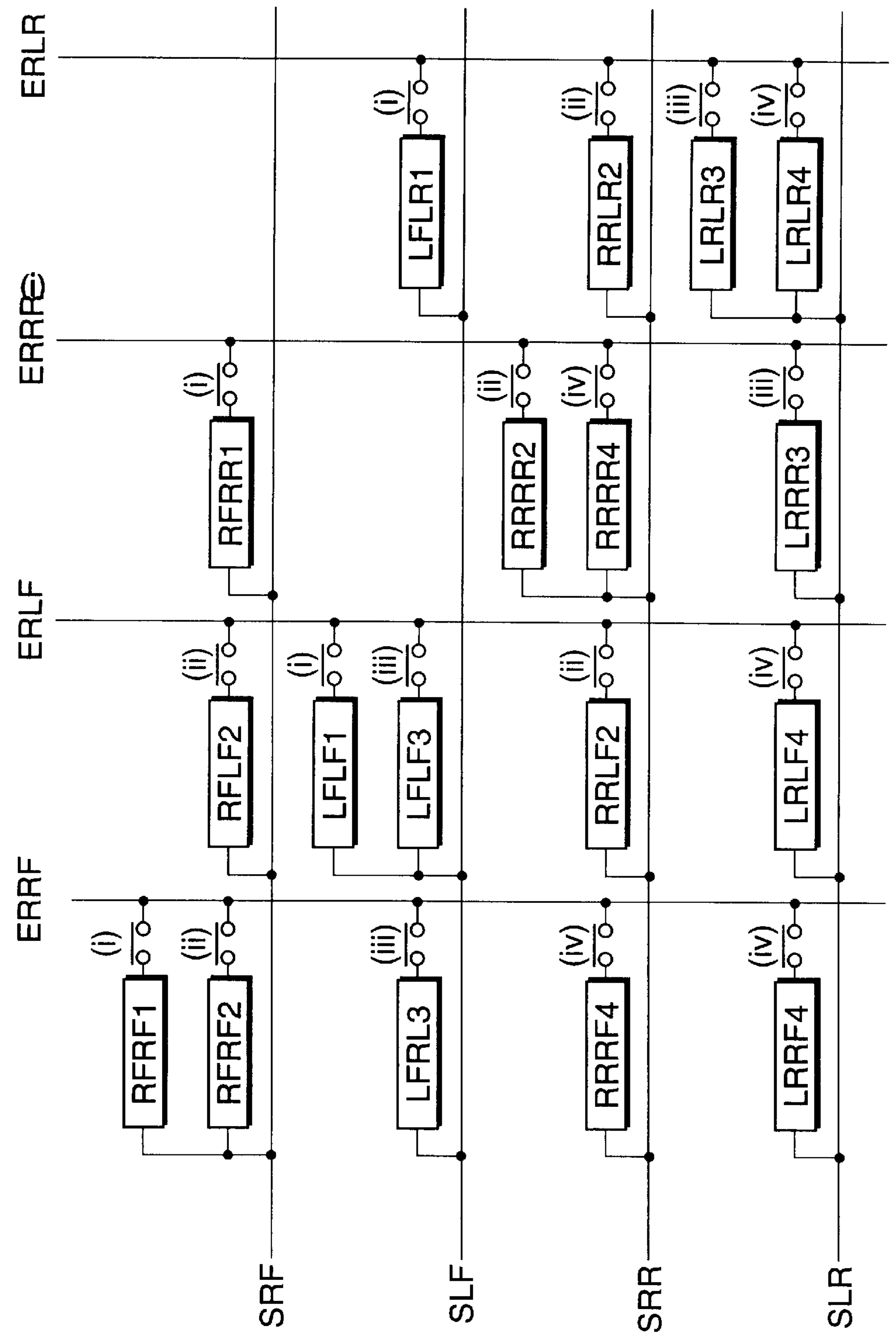
FIG. 14 is a block diagram showing the first exemplary construction of the initial reflected sound generating part.

FIG. 14 shows the first exemplary construction of the initial reflected sound generating part 100, which has a function of switching the transmission functions summarized in FIG. 13 according to a selected imaginary sound source position. In FIG. 14, a transmission function RFRF1 is interposed between the audio source signal SRF and the loudspeaker RF when the imaginary sound source P is positioned in a direction between the loudspeakers RF and LF, and corresponds to the sum of the transmission functions J11A/G1A and J12A/G1A with the prefix (i) in FIG. 13. The other transmission functions RFRF2, RFLF2, . . . are similarly set and correspond to the respective transmission functions in FIG. 13. In FIG. 14, switches with the symbol (i) are closed when the imaginary sound source P is positioned in a direction between the loudspeakers RF and LF. The other switches with symbols (ii)–(iv) are similarly operated to enable the transmission functions with prefixes (ii)–(iv) in FIG. 13.

There may be various manners of switching the switches with prefixes (i)–(iv). For example, they may be switched depending upon whether an audio source signal is present for each channel, in such a manner that the switches with prefix (i) are closed when only the audio source signals SRF and SLF are input to the initial reflected sound generating part 100 and the audio source signals SRR and SLR for the other channels are at zero level.

According to the first exemplary construction, the switching of transmission functions to act upon audio source signals is carried out according to the imaginary sound source position to be represented by the audio source signals, and therefore primary reflected sounds can be created which correspond to the imaginary sound source position rather accurately, and generated for the listener to hear.

(2) Second exemplary construction

The position of the imaginary sound source to be represented by the audio source signals is determined as desired by a user who creates the audio source signals. Therefore, even if transmission functions RFRF1, as shown in FIG. 14 are determined for several supposed imaginary sound source positions, the imaginary sound source position represented by the audio source signals may be deviated from an intended one of such supposed imaginary sound source positions. Further, the audio source signals may represent sounds corresponding respectively to a plurality of different imaginary sound source positions. In this case, no matter how the switches (i)–(iv) are switched, it is impossible to obtain initial reflected sound signals accurately corresponding to each desired imaginary sound source position. Besides, the construction of FIG. 14 requires the use of a circuit for switching the switches and is hence complicated in structure and large in size.

Figure 15:
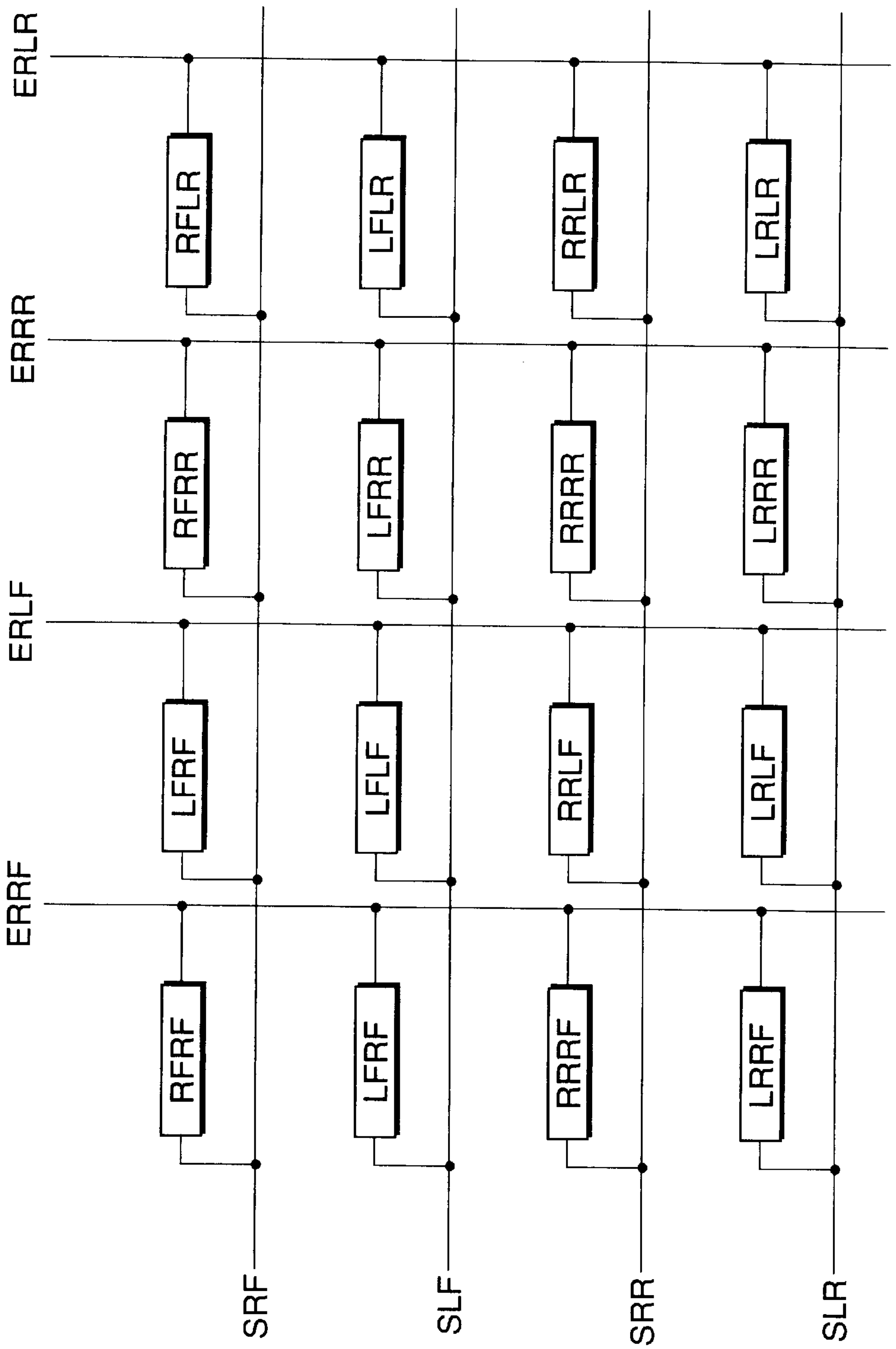
FIG. 15 is a block diagram showing a second exemplary construction of the initial reflected sound generating part.

A second exemplary construction shown in FIG. 15 is an improvement to the first exemplary construction, which has overcome these disadvantages.

In FIG. 15, signal processing circuits corresponding to the transmission functions RFRF, RFRF, . . . are connected between signal lines through which the audio source signals SRF, SLF, SRR and SLR are input, and signal lines through which the initial reflected sound signals ERRF, ERLF, ERRR and ERLR are output.

While in the construction of FIG. 14, switches are provided for connecting or disconnecting signal processing circuits to or from signal lines for the initial reflected sound signals, such switches are not provided in the construction of FIG. 15. In place of the switches, in the construction of FIG. 15, the transmission function of each of the signal processing circuits has a different value from a corresponding one in the construction of FIG. 14.

This change of the transmission function of each signal processing circuit is set so as to minimize deviation between initial reflected sound signals obtained by the construction of FIG. 15 and those obtained by the construction of FIG. 14. For example, while in the construction of FIG. 14 signal processing circuits corresponding to the transmission functions RFRF1 and RFRF2 are provided between a signal line for the audio source signal SRF and a signal line for the initial reflected sound signal ERRF, in the construction of FIG. 15 these signal processing circuits are replaced by a signal processing circuit corresponding to a transmission function RFRF. This transmission function RFRF has a value equal to a mean or average value of the transmission functions RFRF1 and RFRF2. In the construction of FIG. 15, other signal processing circuits corresponding to the other signal processing circuits in the construction of FIG. 14 have been subjected to similar transmission function changes.

According to the second exemplary construction, primary reflected sounds reflecting the imaginary sound source position represented by the audio source signals can be created for the listener to hear, more easily and more simply than in the construction of FIG. 14

(3) Third Exemplary Construction

Figure 16:
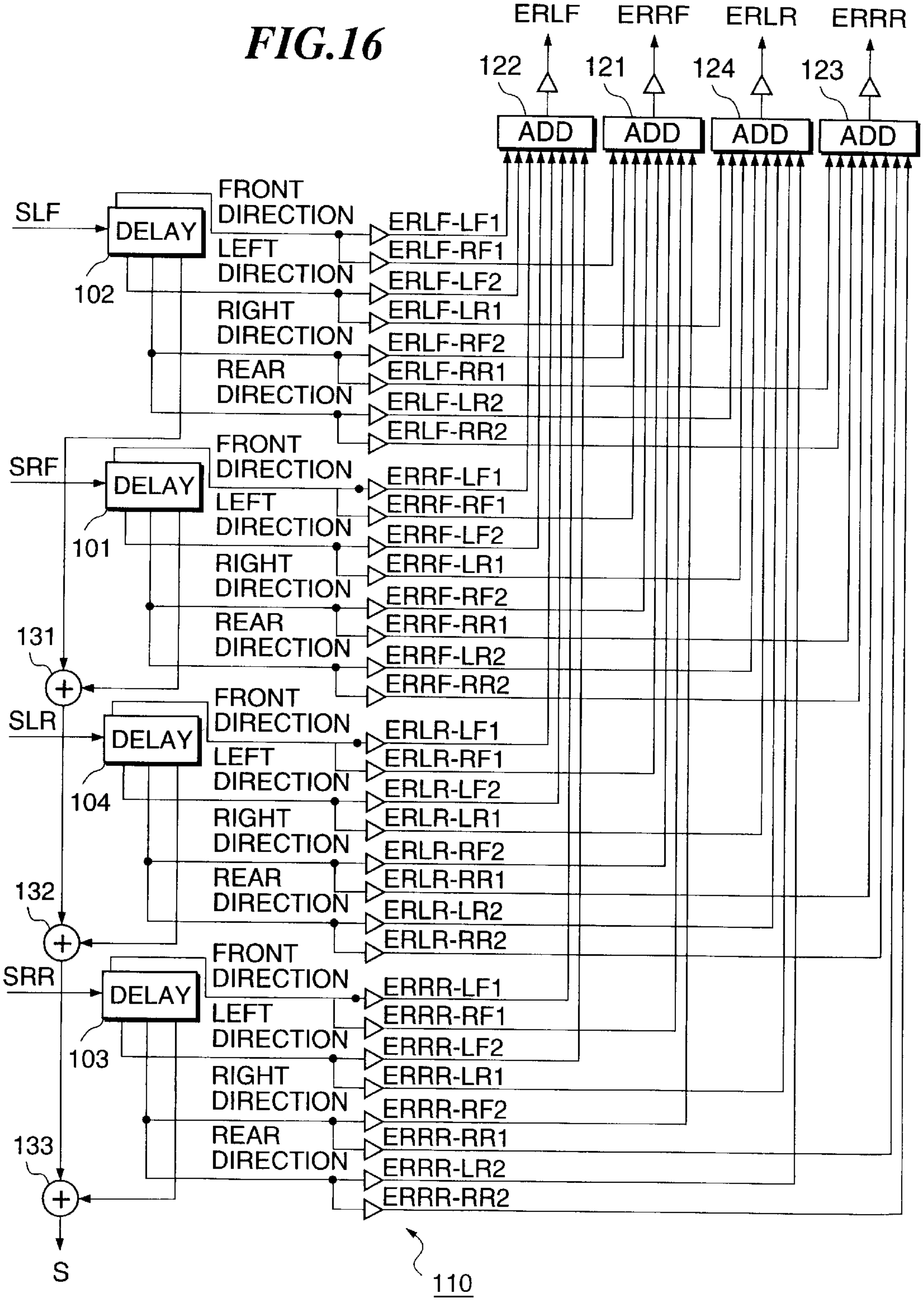
FIG. 16 is a block diagram showing a third exemplary construction of the initial reflected sound generating part.

FIG. 16 shows a third exemplary construction of the initial reflected sound generating part 100. This third exemplary construction is a concrete version of the above described second exemplary construction. The signal processing circuits corresponding to the transmission functions RFRF, . . . in the second exemplary construction are replaced by delay circuits 101–104 for delaying the audio source signals SRF, SLF, SRR and SLR, and a coefficient multiplier group 110 for multiplying delay signals obtained from taps of these delay circuits by predetermined coefficients. Results of multiplication from the coefficient multiplier group 110 are added by adders 121–124, from which results of addition are output as the initial reflected sound signals ERRF, ERLF, ERRR and ERLR. Adders 131–133 add delayed signals obtained from predetermined tap positions of the delay circuits 101–104. Signals resulting from the additions are delivered to the reverberant sound generating part 200 in FIG. 1 as the aforementioned source signal S.

Next, referring to FIGS. 17A–17D, the third exemplary construction will be described more in detail. First, tap positions for taking out delayed signals from the delay circuit 101 corresponding to the audio source signal SRF, coefficients ERRF-LF1, ERRF-RF-1, . . . for multiplication with the delayed signals, and manner of distributing results of the multiplication to the loudspeakers are determined based upon setting conditions shown in FIG. 17A.

Figure 17A:
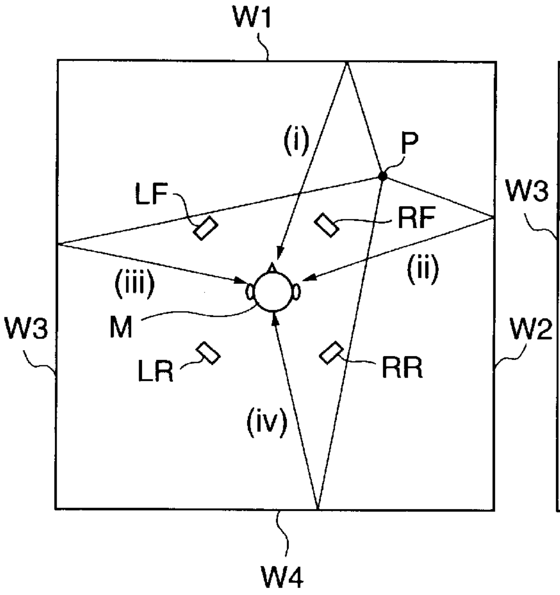
FIGS. 17A to 17D are views useful in explaining manners of designing the third exemplary construction of the initial reflected sound generating part provided that the position of the imaginary sound source is positioned at respective different positions.

In FIG. 17A, an imaginary sound source P corresponding to audio source signals is positioned in a predetermined position close to a right front loudspeaker RF as viewed from the listener M. With this setting, out of the 4-channel audio source signals, only the audio source signal SRF has a level corresponding to sound from the imaginary sound source P, while the other channel audio source signals SLF, SRR and SLR have a level of zero. Therefore, in the third exemplary construction, initial reflected sound signals ERRF, ERLF, ERRR and ERLR corresponding to respective reflected sounds (i)–(iv) shown in FIG. 17A are created from the audio source signal SRF alone. Conversely, the tap positions of the delayed signals of the delay circuit 101 and coefficients for multiplication with the delayed signals obtained therefrom are determined so as to obtain such initial reflected sound signals. This will be explained more specifically as follows:

First, in FIG. 17A, comparing the lengths of transmission paths of the reflected sounds (i)–(iv) from the imaginary sound source P to the listener M, the transmission paths of the reflected sounds (i) and (ii) are relatively short, and those of the reflected sounds (iii) and (iv) are relatively long. Therefore, delayed signals for creating the reflected sounds (i) and (2) are selected from tap positions of the delay circuit 101 which are smaller in number of delay steps from a signal input terminal of the delay circuit 101, and delayed signals for creating the reflected sounds (iii) and (iv) are selected from tap positions which are larger in number of delay steps. In this connection, in the construction of FIG. 16, delayed signals corresponding respectively to the reflected sounds (i)–(iv) are designated as "front direction" "right direction", "left direction", and "rear direction", respectively.

Similarly to the first and second exemplary constructions described above, in the third construction as well, the reflected sound (i) is caused to be heard by the listener M by generating the initial reflected sound signals ERRF and ERLF from the loudspeakers RF and LF. To this end, in the construction of FIG. 16, a delayed signal (front direction) corresponding to the reflected sound (i) is multiplied by the coefficient ERRF-RF1 to generate the initial reflected sound signal ERRF, and further the same delayed signal is multiplied by the coefficient ERRF-LF1 to generate the initial reflected sound signal ERLF. The reflected sound (ii) is caused to be heard by the listener M by generating the initial reflected sound signals ERRF and ERRR from the loudspeakers RF and RR. To this end, in the construction of FIG. 16, a delayed signal (right direction) corresponding to the reflected sound (ii) is multiplied by a coefficient ERRF-RF2 to generate the initial reflected sound signal ERRF, and further the same delayed signal is multiplied by a coefficient ERRF-RR1 to generate the initial reflected sound signal ERRR. The reflected sound (iii) is caused to be heard by the listener M by generating the initial reflected sound signals ERLF and ERLR from the loudspeakers LF and LR. To this end, in the construction of FIG. 16, a delayed signal (left direction) corresponding to the reflected sound (iii) is multiplied by a coefficient ERRF-LF2 to generate the initial reflected sound signal ERLF, and further the same delayed signal is multiplied by a coefficient ERRF-LR1 to generate the initial reflected sound signal ERLR. Lastly, the reflected sound (iv) is caused to be heard by the listener M by generating the initial reflected sound signals ERRR and ERLR from the loudspeakers RR and LR. To this end, in the construction of FIG. 16, a delayed signal (rear direction) corresponding to the reflected sound (iv) is multiplied by a coefficient ERRF-RR2 to generate the initial reflected sound signal ERRR, and further the same delayed signal is multiplied by a coefficient ERRF-LR2 to generate the initial reflected sound signal ERLR.

The amount of attenuation applied to sound generated from the imaginary sound source P should become larger as the transmission path of the sound is longer. Accordingly, under the setting conditions of FIG. 17A, the reflected sounds (i) and (ii) should be heard relatively strongly by the ears of the listener M, and the reflected sounds (iii) and (iv) should be heard relatively weakly. Therefore, in the FIG. 16 construction, the coefficients ERRF-LF1, ERRF-RF1, ERRF-RF2 and ERRF-RR1 for multiplication with the delayed signals corresponding to the reflected signals (i) and (ii) are set to relative large values, while the coefficients ERRF-LF1, ERRF-RF1, ERRF-RF2 and ERRF-RR1 for multiplication with the delayed signals corresponding to the reflected sounds (iii) and (iv) are set to relatively small values.

In FIG. 17A, the reflected sound (i) reaches the listener M from a direction close to the loudspeaker RF as viewed from the listener M. Accordingly, the coefficient ERRF-RF1 is set to a value slightly larger than the coefficient ERRF-LF1 so that the initial reflected sound signal ERRF is larger than the initial reflected sound signal ERLF. The initial reflected sound signals for the other reflected sounds (ii)–(iv) are set similarly to the above. Thus, balance adjustment of the coefficients for multiplication with the delayed signals is carried out in accordance with the directions from which the reflected sounds reach the listener M.

With the third exemplary construction, if the audio source signal SRF corresponding to the position of the imaginary sound source P shown in FIG. 17A is given, it is possible to obtain initial reflected sound signals ERRF, ERLF, ERRR and ERLR accurately reflecting the reflected sounds (i)–(iv) shown in FIG. 17A, respectively, from the given audio source signal SRF.

Figure 17B:
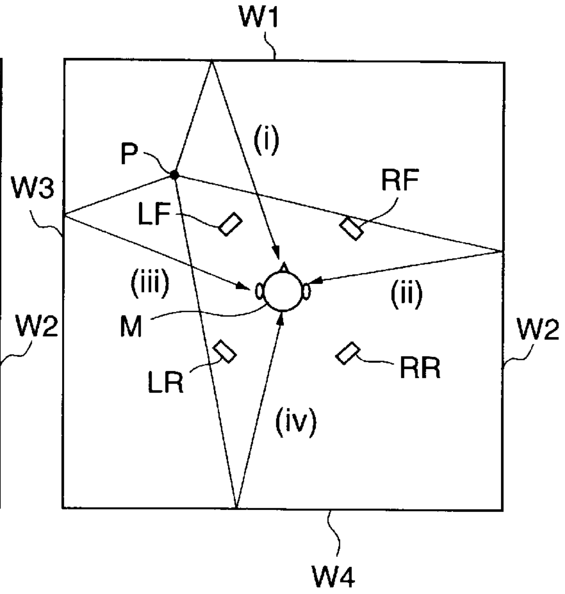
Figure 17C:
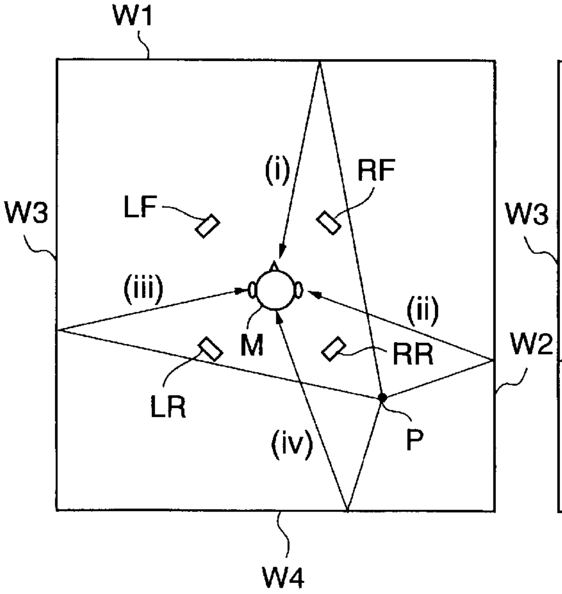

The other portions of the initial reflected sound generating part 100 of FIG. 16 are constructed similarly to the above described portion. That is, a portion including the delay circuit 102 corresponding to the audio source signal SLF and associated multipliers of the coefficient multiplier group 110 connected to the delay circuit 102 is constructed so as to create initial reflected sound signals ERRF, ERLF, ERRR and ERLR reflecting the reflected sounds (i)–(iv) from the audio source signal SLF when the imaginary sound source P is positioned in a predetermined position in a direction close to the left front loudspeaker RF as viewed from the listener M as shown in FIG. 17B. A portion including the delay circuit 103 corresponding to the audio source signal SRR and associated multipliers of the coefficient multiplier group 110 connected to the delay circuit 103 is constructed so as to create initial reflected sound signals ERRF, ERLF, ERRR and ERLR reflecting the reflected sounds (i)–(iv) from the audio source signal SRR when the imaginary sound source P is positioned in a predetermined position in a direction close to the right rear loudspeaker RR as viewed from the listener M as shown in FIG. 17C. Lastly, a portion including the delay circuit 104 corresponding to the audio source signal SLR and associated multipliers of the coefficient multiplier group 110 connected to the delay circuit 104 is constructed so as to create initial reflected sound signals ERRF, ERLF, ERRR and ERLR reflecting the reflected sounds (i)–(iv) from the audio source signal SLR when the imaginary sound source P is positioned in a predetermined position in a direction close to the left rear loudspeaker LR as viewed from the listener M as shown in FIG. 17D.

Figure 17D:
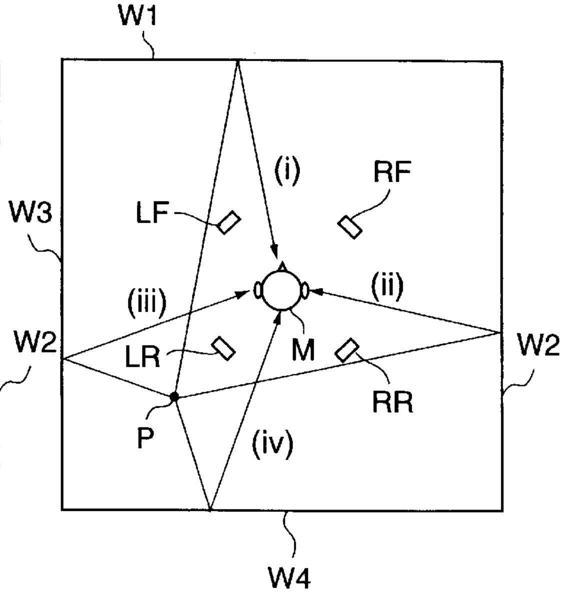

According to the third exemplary construction constructed as above, not only when an audio source signal corresponding to the imaginary sound source position as shown in FIG. 17A is given, but also when audio source signals corresponding to other imaginary sound source positions as shown in FIGS. 17B–17D are given, reflected sounds (i)–(iv) corresponding to these imaginary sound source positions can be caused to be heard by the listener M.

The third exemplary construction of the initial reflected sound generating part 100 may be given audio source signals corresponding to other imaginary sound source positions than those shown in FIGS. 17A–17D.

For example, let it be assumed that audio source signals corresponding to an imaginary sound source position intermediate between the loudspeaker RF and the loudspeaker LF are given to the initial reflected sound generating part 100. In this case, the audio source signals SRF and SLF having certain levels higher than zero are given to the delay circuits 101 and 102. Thus, initial reflected sound signals ERRF, ERLF, ERRR and ERLR are created from delayed signals obtained from the delay circuits 101 and 102.

It can be considered that the created initial reflected sound signals ERRF, ERLF, ERRR and ERLR each consist of a component obtained from the audio source signal SRF (e.g. ERRFa ERLFa, ERRRa and ERLRa), and a component obtained from the audio source signal SLF (e.g. ERRFb, ERLFb, ERRRb and ERLRb).

Here, the components ERRFa ERLFa, ERRRa and ERLRa of the initial reflected sound signals ERRF, ERLF, ERRR and ERLR create reflected sounds (i)–(iv) as shown in FIG. 17A, and the intensity of each of the initial reflected sound signals depends on the level of the audio source signal SRF. On the other hand, the components ERRFb ERLFb, ERRRb and ERLRb of the initial reflected sound signals ERRF, ERLF, ERRR and ERLR create reflected sounds (i)–(iv) as shown in FIG. 17B, and the intensity of each of the initial reflected sound signals depends on the level of the audio source signal SLF.

Thus, when the audio source signals SRF and SLF corresponding to an imaginary sound source position intermediate between the loudspeaker RF and the loudspeaker LF are given to the initial reflected sound generating part 100, it is considered that reflected sounds (i)–(iv) are created, which are intermediate between the reflected sounds (i)–(iv) shown in FIG. 17A and the reflected sounds (i)–(iv) shown in FIG. 17B. It is also considered that such intermediate reflected sounds are not so largely different from reflected sounds to be obtained when the imaginary sound source position is actually in a direction between the loudspeaker RF and the loudspeaker LF.

Thus, according to the third exemplary construction, also when an audio source signal or signals are given, which correspond to an arbitrary imaginary sound source position, it is possible to cause reflected sounds (i)–(iv) reflecting the imaginary sound source position to some degree to be heard by the listener M.

D. Concrete example of the reverberant sound generating part

Figure 18:
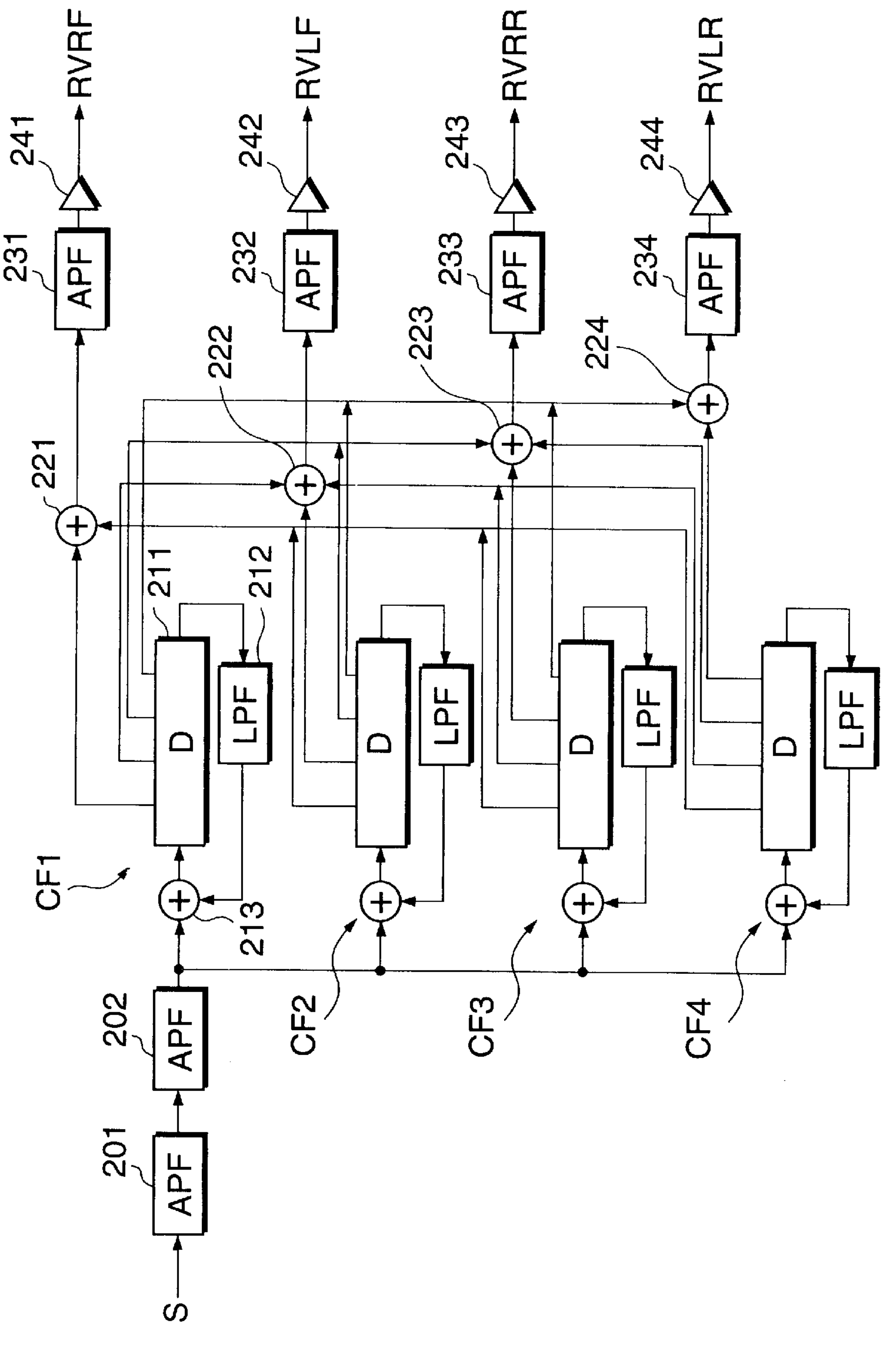
FIG. 18 is a block diagram showing an example of the construction of a reverberant sound generating part of the embodiment.

FIG. 18 shows an example of the construction of the reverberant sound generating part 200. In the reverberant sound generating part, all-pass filters 201 and 202 are provided to apply frequency-dependent phase delays to spectra forming the source signal S given from the initial reflected sound generating part 100 to generate a signal low in similarity to the original source signal.

An output signal of the all-pass filter 202 is input to comb filters CF1–CF4. These comb filters are each comprised of a delay circuit 211, a low-pass filter 212 that attenuates high-frequency spectra of a final stage output signal from the delay circuit 211, and an adder 213 that adds an output signal from the low-pass filter 212 and the output signal from the all-pass filter 202 and delivers the resulting sum to the delay circuit 211. The output signal from the all-pass filter 212, once input to the comb filters, repeatedly passes through the delay circuit 211 and low-pass filter 212 of each comb filter, to have high-frequency spectra thereof reduced by the low-pass filter 212 each time it passes the same. Thus, the comb filters can simulate a phenomenon that whenever reflection of sound repeatedly occurs in an acoustic space, high-frequency components of the resulting reflected sound are attenuated.

Adders 221–224 are each disposed to receive a plurality of signals taken from center taps of the delay circuits 211 of corresponding ones of the comb filters CF1–CF4. The signals supplied to each of the adders 221–22 should preferably be irregular in phase. Also preferably, it should be so arranged that signals which have the same phase combination should not be input to two or more of the adders 221–224. Output signals from the adders 221–224 pass through respective associated all-pass filters 231–234 and then through coefficient multipliers 241–244 to be output as reverberant sound signals RVRF, RVLF, RVRR and RVLR.

E. Other embodiments

In the above described embodiment, the present invention is applied to 4-channel audio source signals. However, the present invention is not limited to this application, but may be applied to multichannel audio source signals of other numbers of channels. Further, although in the above described embodiment, it is supposed that the acoustic space to be simulated is an box acoustic space having four walls W1–W4, the acoustic space may be of any other shape having any other number of walls. Whatever shape the acoustic space has, primary reflected sounds corresponding in number to the number of the walls can be generated. If all the reflected sounds are desired to be heard by the listener M, the initial reflected sound generating part may be modified so as to generate as many reflected sounds as the primary reflected sounds. For example, in the case of the initial reflected sound generating part shown in FIG. 16, four initial reflected sound signals corresponding to four primary reflected sounds generated in “front direction”, “right direction”, “left direction” and “rear direction” are generated. If one or more additional primary reflected sounds are desired to be created, additional coefficient multipliers required for creation of such additional primary reflected sounds may be added to the coefficient multiplier group 110. Further, although in the above described embodiment only primary reflected sounds are created as initial reflected sounds, it may be so arranged that secondary or higher order initial reflected sounds are created, in addition to or alternatively to the primary reflected sounds.

What is claimed is:

1. A sound field effect control apparatus for applying sound field effects to multichannel audio source signals that are input to said sound field effect control apparatus, the apparatus comprising:

an initial reflected sound generating device that generates multichannel initial reflected sound signals from said multichannel audio source signals, wherein a plurality of said initial reflected sound signals are generated from distinct ones of said multichannel audio source signals, and wherein said multichannel audio source signals correspond to respective ones of said plurality of loudspeakers, and are each created based upon a first transmission function of a signal transmission path extending from said imaginary sound source at said predetermined position to ears of the listener, a second transmission function of a signal transmission path extending from said imaginary sound source at said predetermined position to a corresponding one of said plurality of loudspeakers, and a third transmission function of a signal transmission path extending from said corresponding one of said plurality of loudspeakers, and said initial reflected sound generating part creates said multichannel audio source signals to signal processing based upon a fourth transmission function forming a transmission function of a signal transmission path extending from said imaginary sound source at said predetermined position to the ears of the listener, and said second transmission function.

* * * * *